United States Patent
Lim et al.

[11] Patent Number: 6,027,604
[45] Date of Patent: Feb. 22, 2000

[54] DRY ETCHING APPARATUS HAVING UPPER AND LOWER ELECTRODES WITH GROOVED INSULATING RINGS OR GROOVED CHAMBER SIDEWALLS

[75] Inventors: Joung-hyun Lim; Hee-Sun Chae, both of Yongin, Rep. of Korea

[73] Assignee: Samsung Electronics Co., Ltd., Suwon, Rep. of Korea

[21] Appl. No.: 09/073,250

[22] Filed: May 6, 1998

[30] Foreign Application Priority Data

May 7, 1997 [KR] Rep. of Korea .................. 97-17349

[51] Int. Cl.$^7$ ........................................ B08B 7/00
[52] U.S. Cl. ................. 156/345; 118/723 E; 118/715; 118/724
[58] Field of Search ................ 156/345; 118/723 E, 118/715, 724, 728, 500

[56] References Cited

U.S. PATENT DOCUMENTS 5,711,813  1/1998  Kadoiwa et al. .................. 118/723 E
5,714,031  2/1998  Mundt et al. ........................ 156/345

OTHER PUBLICATIONS

"Vacuum Technology Manual" Published by Industrial Research Association in Japan in Aug., 1990.
"Technology of Vacuum" Published by Industrial Technology Service Center Co. Ltd. in Japan in Nov. 1990.

*Primary Examiner*—Maria Nuzzolillo
*Assistant Examiner*—Monique M Wills
*Attorney, Agent, or Firm*—Jones Volentine, LLP

[57] ABSTRACT

A dry etching apparatus is capable of suppressing formation of reaction products (i.e., polymers) in an etching chamber. A gas supply is connected to the top of the etching chamber by a first gas duct, and a pump is connected to the bottom of the etching chamber by a second gas duct. An upper electrode is furnished in the etching chamber. At a location opposed to the upper electrode, a lower electrode is furnished. Insulation plates of the upper and the lower electrodes, or an insulation plate of either of the upper or the lower electrode, include a plurality of grooves. The etching chamber may include a plurality of grooves and projections on its sidewalls. The plurality of projections in the sidewalls has a semicircular or a rectangular cross-section, and may be formed as a single body or as individually detachable projection bodies. Accordingly, it is possible to improve the conductance and exhaustion velocity in the etching chamber using the plurality of grooves in the insulation plates of the electrodes and the grooves in the sidewalls of the chamber. As a result, the formation of polymers that may act as particles during an etching process can be suppressed. Additionally, the accumulated polymers can be more widely dispersed.

14 Claims, 7 Drawing Sheets

DRY ETCHING APPARATUS HAVING UPPER AND LOWER ELECTRODES WITH GROOVED INSULATING RINGS OR GROOVED CHAMBER SIDEWALLS

BACKGROUND OF THE INVENTION

1. Field of the Invention

The present invention relates to a dry etching apparatus, and more specifically, to a dry etching apparatus capable of effectively exhausting reaction products in an etching chamber by adjusting vacuum conductance therein. The adjustment of vacuum conductance may be made possible by providing the dry etching apparatus with upper and lower electrodes having insulating rings with grooves therein. In addition, the adjustment of vacuum conductance may be made possible by providing the chamber of the dry etching apparatus with grooved sidewalls.

2. Background of the Related Art

In dry etching, an etching gas is supplied to and reacts with a material to be processed (e.g., a film on a wafer) to form products having high vapor pressure or high volatility. Accordingly, the etching gas is selected based on the consideration that desirable products be obtained by a reaction between the material and the etching gas. Since the material is generally formed of a silicon compound such as Si, $SiO_2$, $Si_3N_4$, and the like, an etching gas including a halogen element as a base (e.g., a fluorine based gas) is generally used for etching the silicon compound.

The dry etching is conventionally accomplished in an apparatus as schematically shown in FIG. 1. referring to the drawing, the structure of the dry etching apparatus will be described in detail hereinafter.

The dry etching apparatus includes a chamber 8 that provides a space for dry etching processes. A wafer 30 to be etched is transferred into the chamber 8. At the top of the chamber 8, a first gas duct 12 is formed to allow gas insertion from a gas supply 10. A vacuum pump 18 for providing vacuum pressure to the chamber 8 is connected to Ache bottom of the chamber 8 by a second gas duct 16, which opens into the chamber 8 at exhaust orifice 17. An upper electrode 13 and a lower electrode 14 are installed in the chamber 8 and maintain the pressure in the area where a discharge occurs.

Upper and lower electrodes 13 and 14 have a circular shape. The upper electrode 13 is spaced apart from and opposed to the lower electrode 14. FIGS. 2 and 4 show top views of the electrodes 13 and 14, respectively.

Referring to FIG. 2, the upper electrode 13 includes a gas diffuser plate 22 having a plurality of gas diffusers 24, and an insulation plate 20 fixed and installed around the gas diffuser plate 22 by a plurality of screws 15. The plurality of the screws 15 is arranged and installed in such a manner that the lines established by joining the center of the insulation plate 20 and two adjacent screws of the plurality of screws 15 form an angle of 45°, that is, the screws 15 are circumferentially spaced at 45° intervals. The screws 15 are installed at a common radial distance from the center of the insulation plate 20.

FIG. 3 is a side view of the upper electrode 13 showing an incline area, having a predetermined width I, formed between the gas diffuser plate 22 and the insulation plate 20. The incline area is formed at an angle of 45° with respect to the horizontal surface of the gas diffuser plate 22 or the insulation plate 20.

During the etching process, the gas diffuser plate 22 suitably mixes and uniformly distributes the etching gas supplied from the gas supply 10. When the mixed etching gas is uniformly distributed, the gas diffuser plate 22 spreads the mixed etching gas in a wide area.

The lower electrode 14, as shown in the top view of FIG. 4, includes a wafer stage 26 for supporting the wafer and an insulation plate 28 fixed and installed around the wafer stage 26 by a plurality of screws 15. The plurality of screws 15 are arranged and installed in the same manner as screws 15 in upper electrode 13, that is, they are circumferentially spaced at 45° intervals.

As shown in FIG. 4, the outer edge of the wafer 30 and the outer edge of the wafer stage 26 define an exposed area having a width II on the wafer stage 26 when the wafer is placed thereon. In this embodiment, the wafer 30 is smaller than the wafer stage 26, however the wafer 30 may be the same size as the wafer stage 26.

P1, P2 and P3 in FIG. 1 are a front pressure of the gas diffuser plate 22, a back pressure of the gas diffuser plate 22 and a pressure of the exhaust orifice 17, respectively. P2 is actually the reaction pressure and, therefore, it is maintained at a predetermined level during the etching process.

The dry etching process in the dry etching apparatus begins with loading a wafer, ti which a material (e.g., an oxidation layer) to be etched is deposited, on the lower electrode 14 in the chamber 8. Under this condition, a gas, such as $CF_4$, $CHF_3$, He, $Cl_2$, Ar, HBr, $O_2$ and the like, is supplied to the chamber 8 from the gas supply 10. The material reacts with the gas and forms products having high vapor pressure or high volatility. As a result, the material is etched.

For example, assuming that a gas of 100 sccm is introduced into the chamber 8 from the gas supply 10 and the process pressure P2 is 2 Torr, the exhaust velocity S in the chamber 8 is calculated by the following formula, where Q is the quantity of the gas supplied to the chamber 8:

$$S = Q/P2 = \{760(\text{Torr}) \cdot 0.1(l/\min)\}/2(\text{Torr}) \quad (1)$$

$$= 6.3 \cdot 10^{-1}(l/\sec)$$

Most reaction products (e.g., CO, HF and so on) have a low vapor pressure. Accordingly, the reaction products are converted into the gaseous state upon reacting with the material, and are exhausted through the exhaust orifice 17 and second gas duct 16 out of the chamber 8 at the exhaust velocity. However, the reaction products cannot be completely exhausted out of the chamber 8 due to the circumference temperature, pressure and other influences. As a result, some products (e.g., CnFn) remain and are accumulated to form a deposit, i.e., a polymer contaminant.

The polymer is a main source of contaminating particles during the etching process and induces an arc (also known as an insulation break), which adversely influences the Etching process.

The arc causes two main problems. First, in the event the temperature in the Chamber 8 exceeds a critical temperature (e.g., 130° C.), a mask of a photoresist material is a transformed and cannot serve as a normal mask. This results in deteriorated patterns. Second, in the event a part of the gas diffuser plate 22 of the upper electrode 13 is broken away by an arc discharge, the broken part serves as contaminating particles in the etching process. This results in a defective etching process.

The polymer consists of various materials and is concentrated and accumulated mainly on the sidewalls of the chamber 8, around the exhaust orifice 17 of the second gas duct 16 and the area II on the lower electrode 14.

Accordingly, to suppress particle formation, the reaction products induced during the etching process should be guided in a predetermined direction and rapidly exhausted by enhancing the conductance of the exhaust orifice.

SUMMARY OF THE INVENTION

The present invention provides a dry etching apparatus capable of effectively exhausting reaction products out of an etching chamber by enhancing the conductance of a gas exhaust orifice in such a manner that a plurality of grooves are formed in insulation spates of an upper electrode and a lower electrode, without enlarging the width of a second gas duct or shortening the length of the second gas duct.

An object of the present invention is to provide a dry etching apparatus capable of suppressing particle formation due to contaminating particles by modifying the structures of internal devices (upper and lower electrodes and/or sidewalls of the an etching chamber) and accordingly enhancing the conductance of a gas exhausting orifice.

To achieve the above and other objects, the dry etching apparatus includes: an etching chamber providing a space for etching processes; a gas supply connected to the top of the etching chamber by a first gas duct; a pump connected to the bottom of the etching chamber by a second gas duct; a circular gas diffuser plate arranged in an upper part of the etching chamber and having a plurality of gas diffusers; an upper electrode having a ring-shaped insulation member in which a plurality of grooves are formed; a circular wafer stage for supporting a wafer, arranged in a lower part of the etching chamber and opposed to the upper electrode; and a lower electrode having a ring-shaped insulation member in which a plurality of grooves are formed.

When a uniform exhaustion criteria is required in the respective directions of the chamber, the plurality of grooves are formed in the insulation members in a symmetrical structure such that the number of the grooves, the size of the grooves and the intervals between the grooves are symmetrical across the center of the insulation members. The exhaustion feature of the chamber can be changed by changing the number of grooves, the size of the grooves and the intervals between the grooves.

The number of grooves is preferably one hundred and thirty six, which are arranged at equal distances from each other in such a manner that groups of seventeen of them are arranged at intervals of 45°. In order to maximize the conductance in the 45° interval, it is preferable to design each of the projections between the grooves to have a rectangular cross-section, with the grooves having essentially a square cross-section. In this case, the centerline in the width direction of an $n^{th}$ groove and the centerline in the width direction of an $(n+1)^{th}$ groove adjacent to the $n^{th}$ groove form an angle of 2°. Preferably, the distance between the n groove and the $(n+1)^{th}$ groove is 0.2 cm. Preferably, the groove has a height and a base thickness of about 0.25 cm.

The plurality of grooves may be formed in either of the insulation plates of the upper or the lower electrode. The sidewalls of the chamber may also contain a plurality of projections defining grooves. Each of the plurality of projections formed on the inside sidewalls of the etching chamber may have a semicircular or a rectangular cross-section. The plurality of projections and grooves may be formed in a single body or the respective projections may be detachably formed. The areas of the insulation member of the upper or the lower electrode, and the areas of the inside sidewalls of the etching chamber, in which the grooves are formed are made of a conductive material (e.g., Al) on which a thin layer of an insulating material (e.g., ceramic or $Al_2O_3$) is coated.

When the dry etching apparatus includes the aforementioned structure, the plurality of grooves are capable of enhancing the conductance in the etching chamber. As a result, it is possible to effectively exhaust process induced reaction products out of the dry etching apparatus without any changes in electrical features. Additionally, it is possible to disperse accumulated polymers by the plurality of grooves.

Further features and advantages of the invention will readily be apparent from the specification and from the drawings. It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate an embodiment of the invention, in which.

DETAILED DESCRIPTION OF PREFERRED EMBODIMENTS

The dry etching apparatus according to the present invention will be hereinafter described in detail, with reference to the accompanying drawings.

Figure 1:
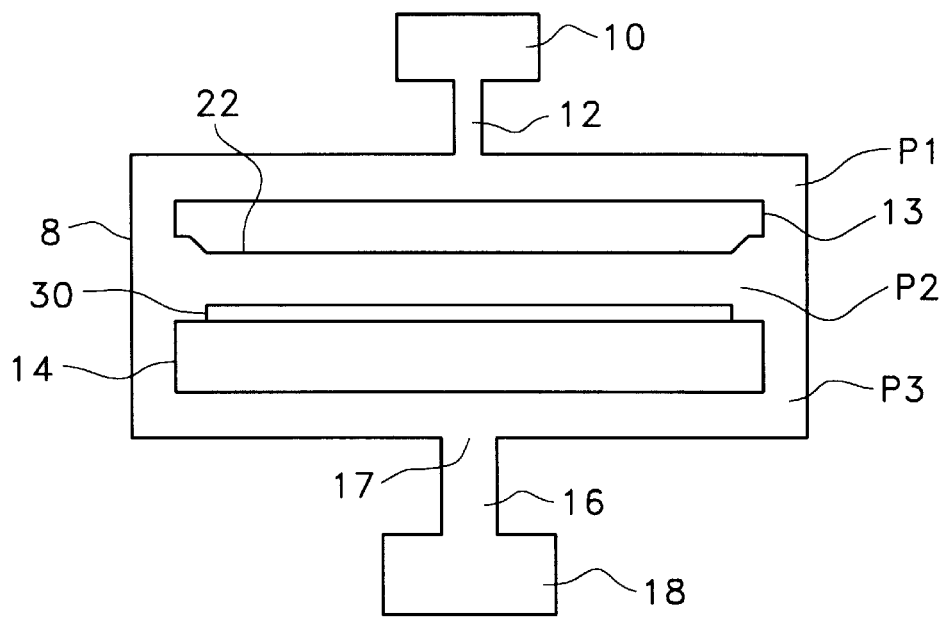
FIG. 1 is a schematic diagram of an etching chamber of a conventional dry etching apparatus.
Figure 2:
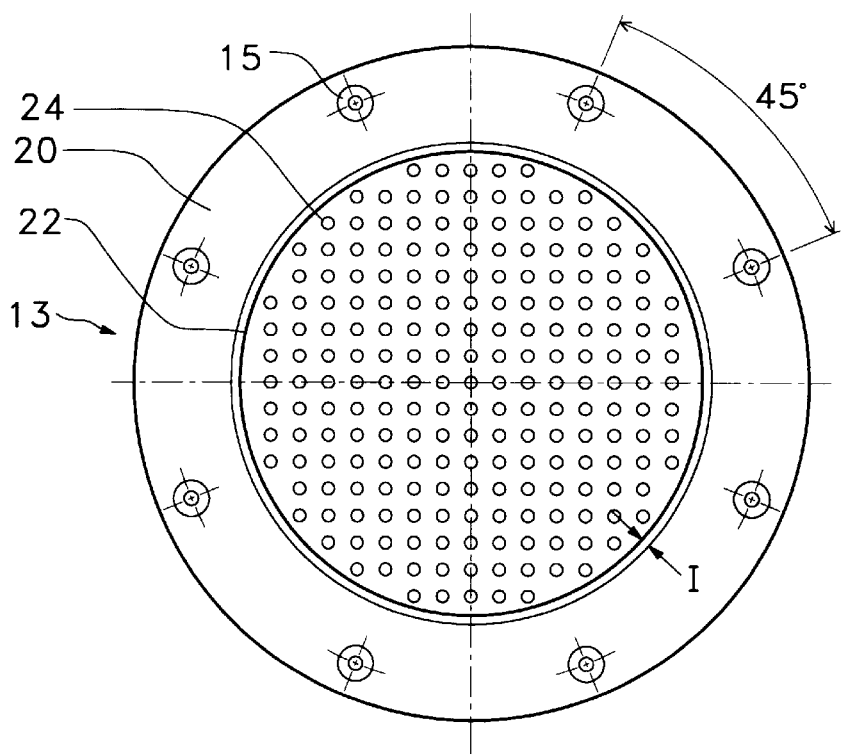
FIG. 2 is a top view of an upper electrode in the etching chamber of FIG. 1.
Figure 3:
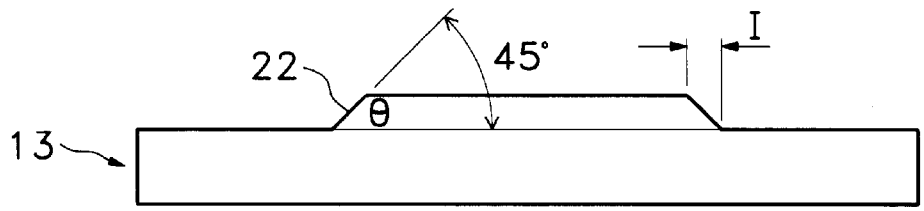
FIG. 3 is a side view of the upper electrode taken along the line 3—3 of FIG. 2.
Figure 4:
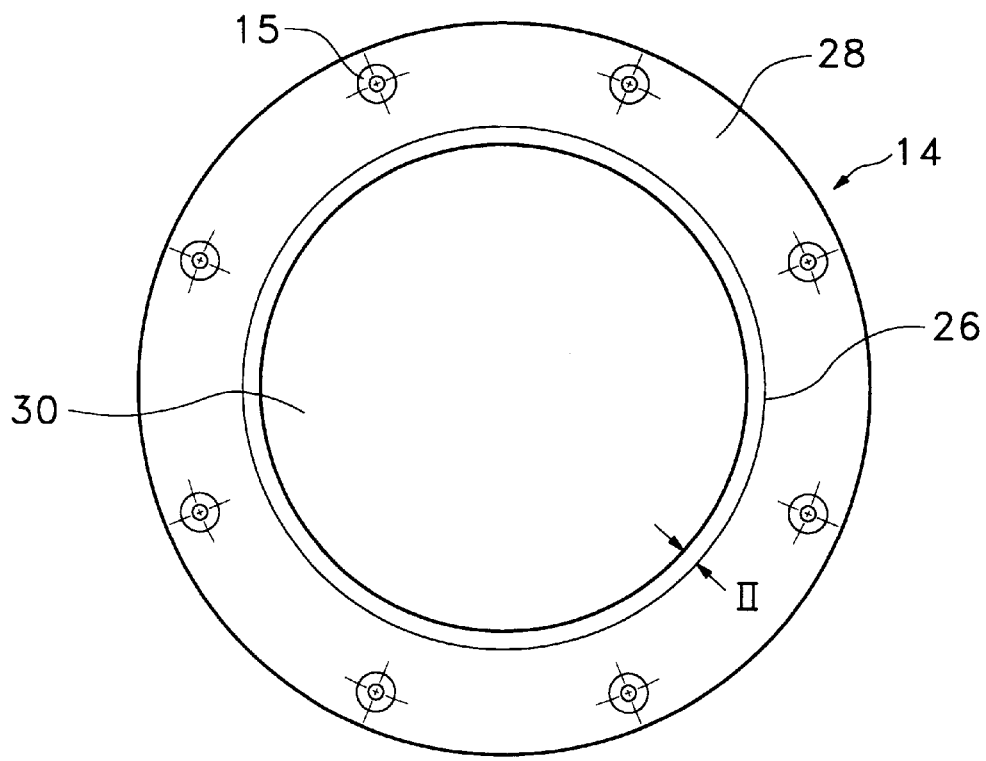
FIG. 4 is a top view of a lower electrode in the etching chamber of FIG. 1.
Figure 5:
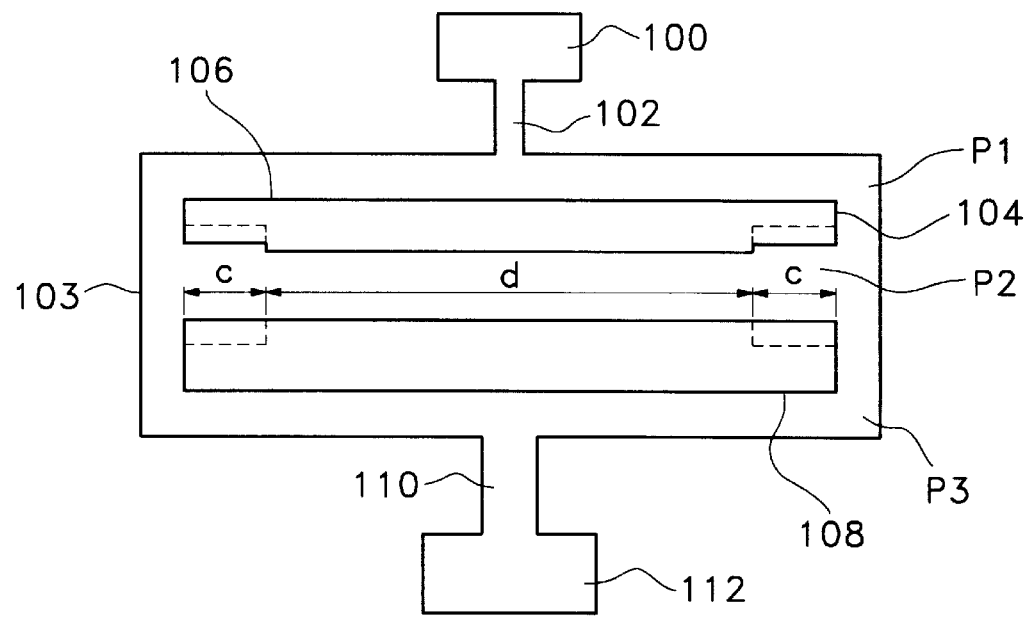
FIG. 5 is a schematic diagram of an etching chamber of a first embodiment of the dry etching apparatus according to the present invention.

FIG. 5 is a schematic view of a first embodiment of the dry etching apparatus according to the present invention, wherein upper and lower electrodes 104 and 1 08 include a plurality of grooves defined by a plurality of projections on their respective insulation plates.

As shown in FIG. 5, the dry etching apparatus includes a chamber 103 providing a space for performing a dry etching process. The top of the chamber 103 is connected to a first gas pipe 102 that is connected to a gas supply 100. An etching gas from the gas supply 100 is introduced into the chamber 103 through the first gas pipe 102. A vacuum pump 112 is connected to the bottom of the chamber 103 by a second gas pipe 110. The vacuum pump 112 maintains the space inside the chamber 103 at a vacuum pressure. Upper and lower electrodes 104 and 108 having a plurality of grooves are furnished in the chamber 103.

The upper and the lower electrodes 104 and 108 each have a circular shape and are spaced apart from and opposed to each other. The detailed structures thereof are illustrated in FIGS. 6 and 7, which are top views of the upper electrode 104 and the lower electrode 104 of the dry etching apparatus in FIG. 5, respectively.

Figure 6:
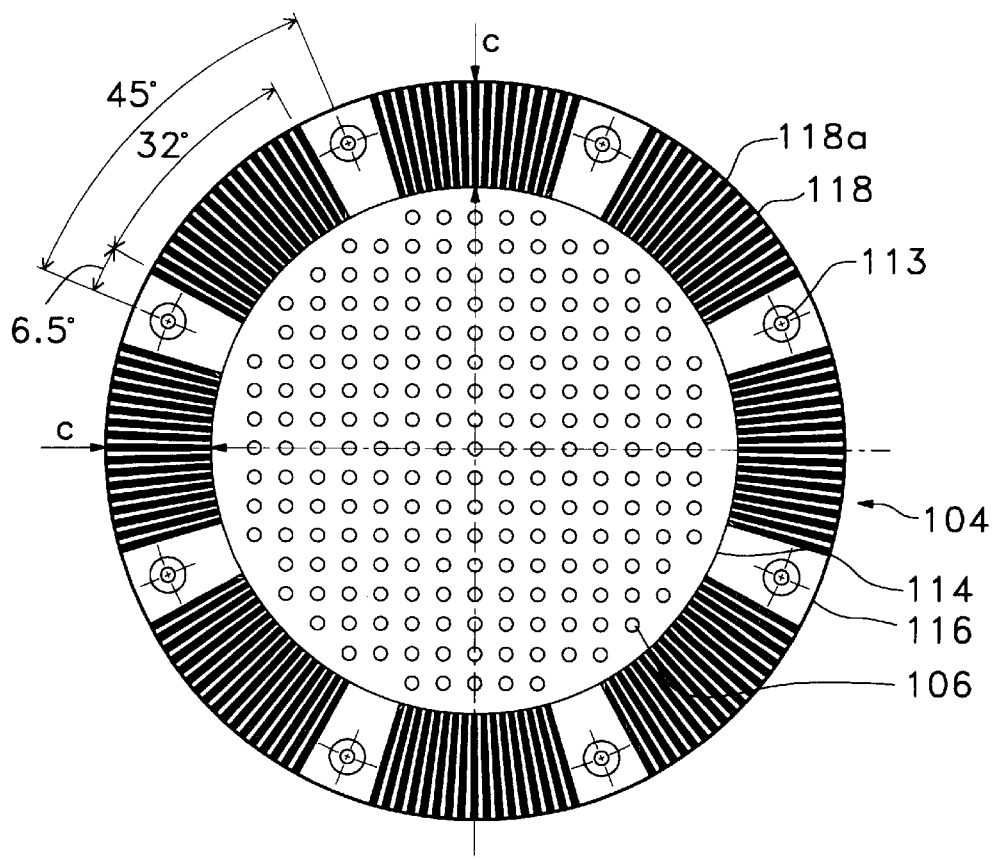
FIG. 6 is a top view of an upper electrode in the etching chamber of FIG. 5 with Symmetrical grooves.

Referring to FIG. 6, the upper electrode 104 includes a gas diffuser plate 114 Waving a plurality of gas diffusers 106, and a first ring-shaped insulation plate 116 having a plurality of grooves 118a extending radially from the inner circumference of insulation plate 116 to the outer circumference thereof. The grooves 118a are defined by a plurality of projections 118. In FIGS. 5 and 6, the radial width of the plurality of grooves is indicated by reference letter 'c'.

Figure 7:
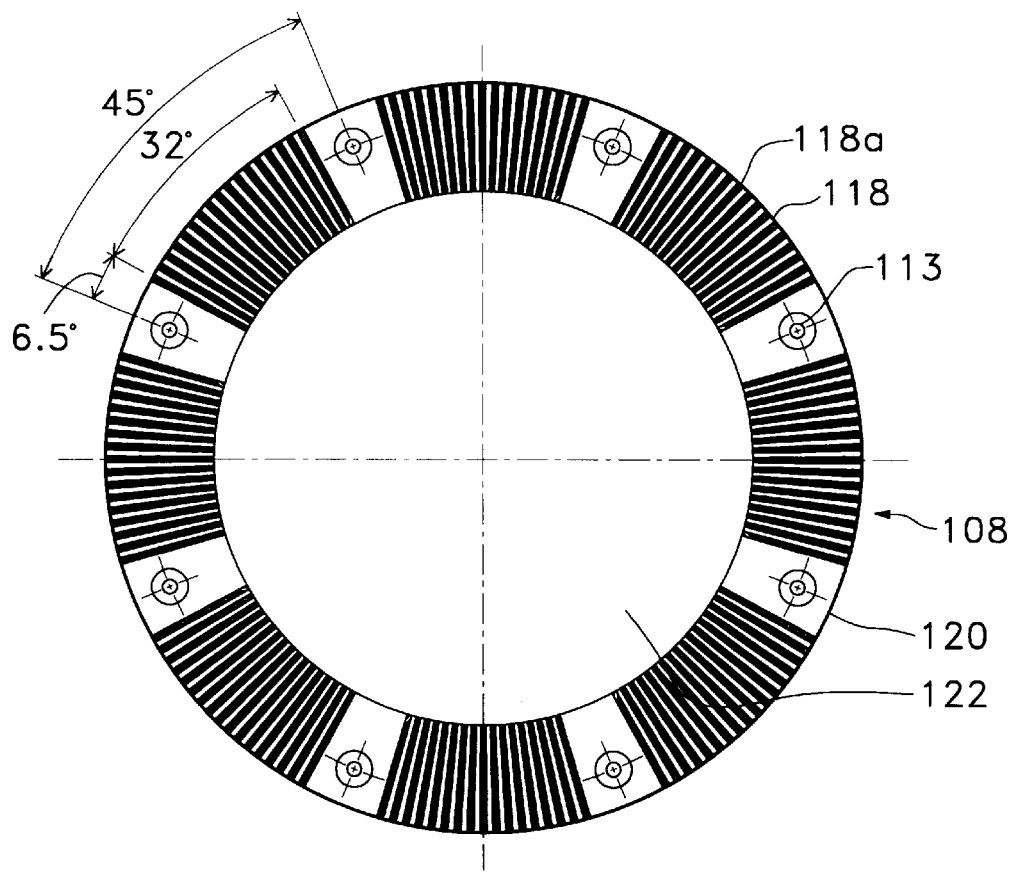
FIG. 7 is a top view of a lower electrode in the etching chamber of FIG. 5 with symmetrical grooves.

Referring to FIG. 7, the lower electrode 108 includes a wafer stage 122 for supporting a wafer and a second ring-shaped insulation plate 120 having a plurality of grooves 118a defined by a plurality of projections 118. In FIG. 5, reference letter 'd' indicates the width of wafer stage 122 and reference letter 'c' is the radial width of the plurality of grooves 118a.

Since the exhaustion feature of the chamber 103 depends on the location of an exhaust port thereof, the plurality of grooves 118a are formed in the first and the second ring-shaped insulation plates 116 and 120 in a symmetrical structure such that the plurality of grooves 118a are symmetrically arranged about a line passing through the renter of the first and the second ring-shaped insulation plates 116 and 120, so as to achieve a uniform exhaustion process from the chamber 103.

When the grooves 118a are formed in such a symmetrical structure, the turbulence of a gas generated at the exhaust port can be controlled so as to have a low level of molecular flow. Accordingly, the gas flow out of the chamber 103 can be maintained at a uniform partial pressure.

The exhaustion process from the chamber 103 can be changed by changing the number and the size of the grooves 118a according to the locations thereof.

When the number of the grooves 118a is increased the conductance is accordingly increased, up to a certain level. Beyond that, a saturation condition exists whereby a further increase in the number of the grooves 118a produces no further increase in the conductance effect. Therefore, the number of the grooves 118a should be controlled based on the consideration of manufacturing limitations and a maximum possible degree of the conductance. This maximum number of grooves varies with the particular dry etching apparatus configuration and could be determined without undue experimentation.

In this preferred embodiment, one hundred and thirty six grooves 118a are formed in the first and the second insulation plates 116 and 120 of the upper and the lower electrodes 104 and 108. A preferable arrangement of the 136 grooves 118a is as follows.

A plurality of screws 113 is arranged on first and second insulation plates 116 and 120 in such a manner that the lines established by joining the center of the plates 116 and 120 and two adjacent screws 113 of the plurality of screws 113 form an angle of 45°, in other words, the screws 113 are circumferentially spaced at 45° intervals. The screws 113 are installed at a common radial distance from the center of the insulation plates 116 and 120. In order to form the one hundred and thirty six grooves 118 a in a symmetrical structure, seventeen grooves 118a thereof should be arranged in intervals between each pair of adjacent screws 113.

Figure 8:
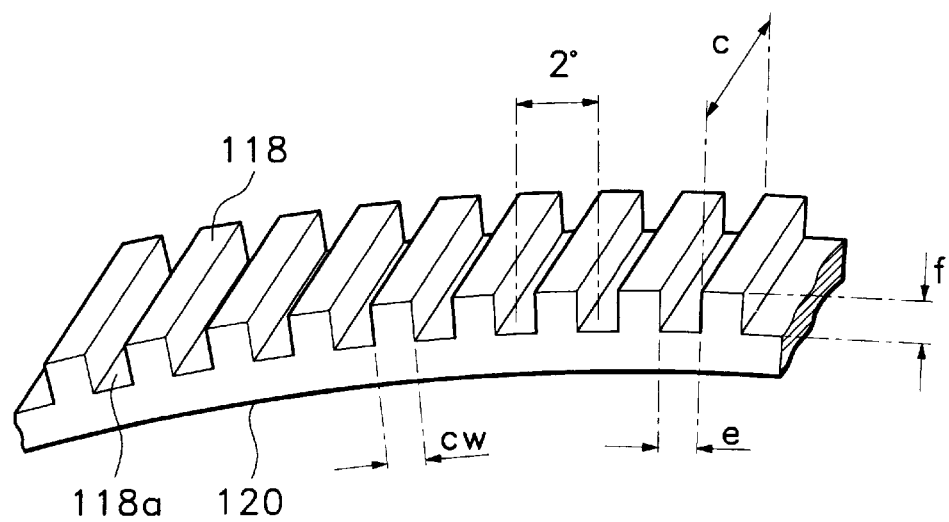
FIG. 8 is a perspective view of a portion of the projections and grooves in the insulating rings of the electrodes of FIGS. 6 and 7.

The grooves 118a are formed at the same intervals to achieve uniform exhaustion from the chamber 103. To maximize the conductance the 45° intervals between the screws 113, the projection 118 between the grooves 118a has a rectangular cross-section as shown by FIG. 8. FIG. 8 shows a portion of insulation plates 116 and 120, including several grooves of the plurality of grooves 118a.

Referring to FIG. 8, the centerline in the width direction of an $n^{th}$ groove 118a of the plurality of grooves 118a and the centerline in the width direction of an $(n+1)^{th}$ groove 118a adjacent to the $n^{th}$ groove 118a form an angle of 2°. An interval between the $n^{th}$ groove 118a and an $(n+1)^{th}$ groove 118a, ranges from 0.18 to 0.22 cm, preferably 0.2 cm. In other words, the circumferential width 'cw' of the projection is 0.2 cm. The respective grooves 118a have the following dimensions: a height 'f' ranging from 0.24 to 0.26 cm, preferably 0.25 cm; a base thickness 'e' ranging from 0.24 to 0.26 cm, preferably 0.25 cm; and a width 'c' ranging from 7.3 to 7.7 cm, preferably 7.5 cm. The angle established by the centerline in the width direction of the $n^{th}$ groove 118a and the centerline in the width direction of the $(n+1)^{th}$ groove 118a is limited to 2° due to mechanical manufacturing limitations.

When the plurality of grooves 118a are formed in the aforementioned manner, the angle occupied by the seventeen grooves 118a within an interval of 45° between two adjacent screws 113 is 32°. Accordingly the seventeen grooves 118a are formed between points respectively spaced apart from the screws 113 by 6.5°, which is calculated by halving the difference between 45° and 32°. The area of the insulation plates where grooves 118a are formed is made of a conductive material (e.g., Al) on which a thin layer of an insulation material (e.g., ceramic or $Al_2O_3$ and so on) is coated.

Figure 14:
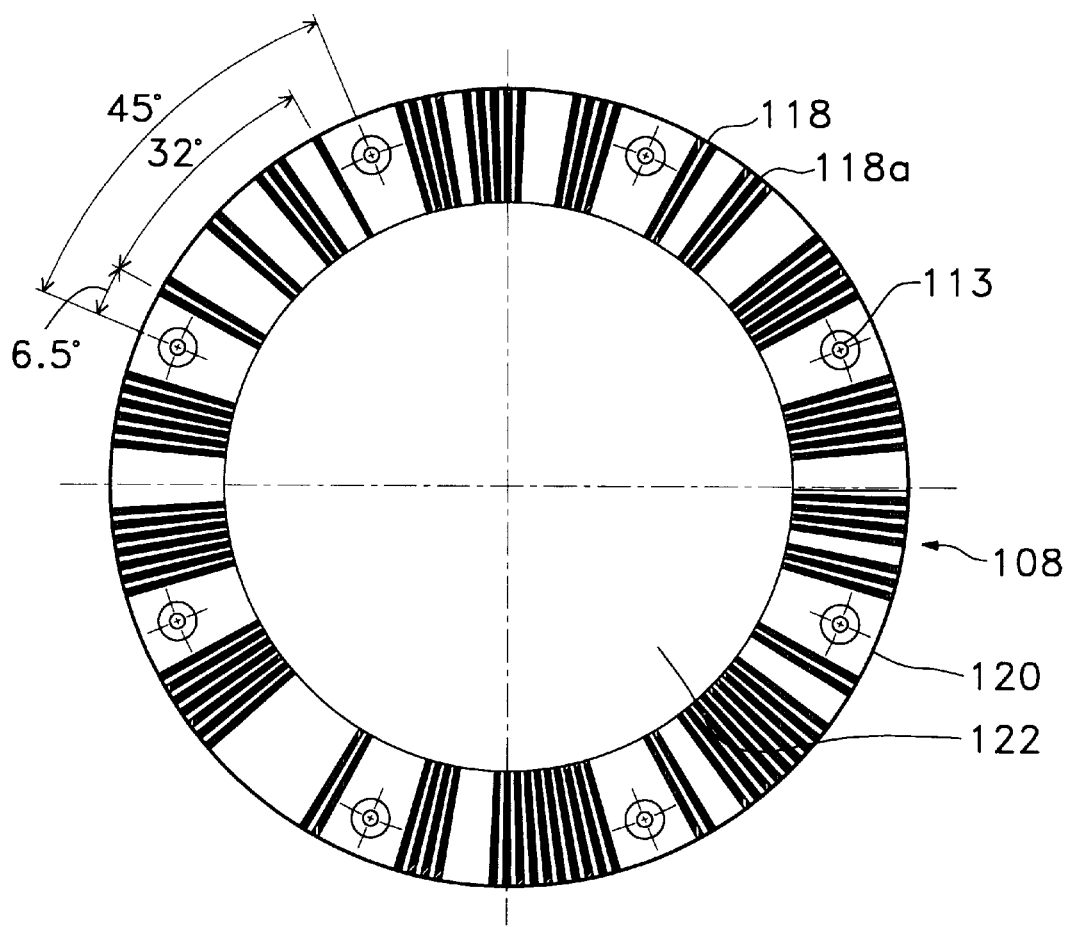
FIG. 14 is a-Hop view of an upper electrode with asymmetric grooves.

The grooves on the upper and lower insulation plates as described above are arranged symmetrically around the circumference of the insulation plates. However, it is possible to modify the upper and/or lower insulation plate such that the grooves 118a are asymmetrically arranged, such that the number of grooves, the size of the grooves and the interval between the grooves is not the same at all locations around the circumferences of the insulation plates as shown in FIG. 14.

Figure 9:
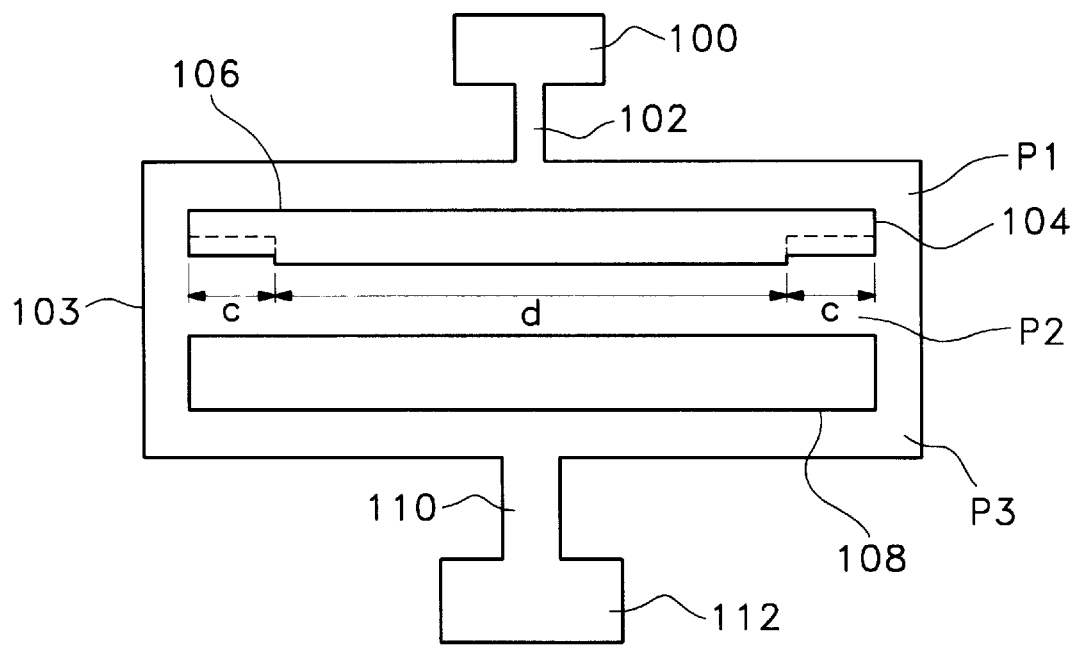
FIG. 9 is a schematic diagram of an etching chamber of a second embodiment of the dry etching apparatus according to the present invention.
Figure 10:
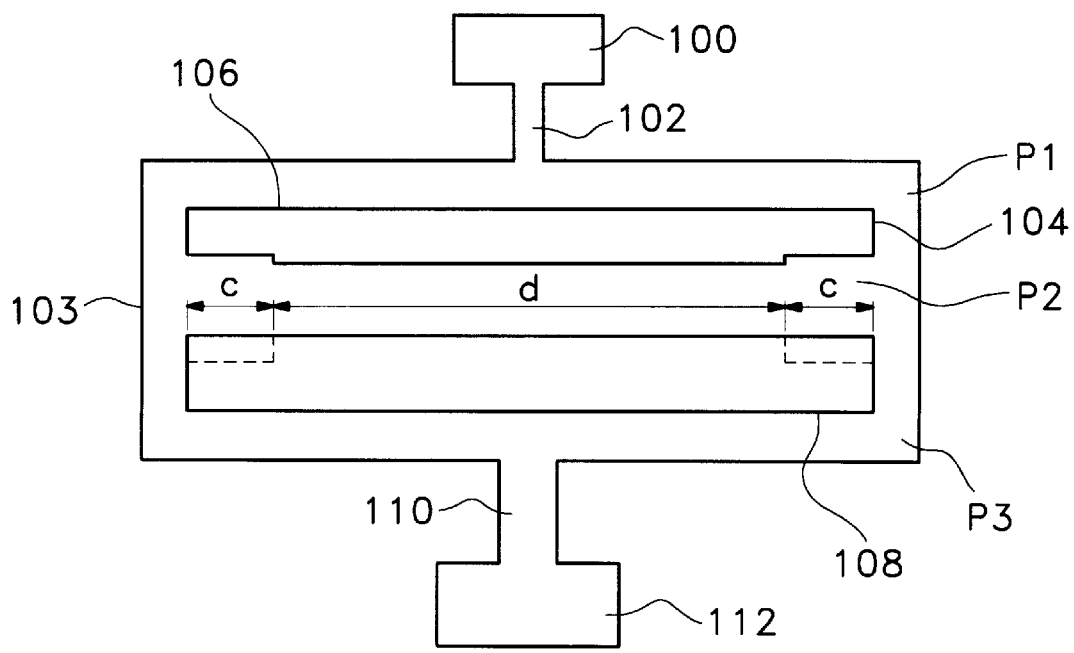
FIG. 10 is a schematic diagram of an etching chamber of a third embodiment of the dry etching apparatus according to the present invention.

The dry etching apparatus may also be modified to have the plurality of grooves 118a on either the upper electrode 104 or the lower electrode 108, instead of on both of the electrodes 104 and 108 as shown in FIGS. 6 and 7. FIGS. 9 and 10 show the modified embodiments.

FIG. 9 is a schematic view of a second embodiment of the dry etching apparatus according to the present invention, wherein only insulation plate 116 of upper electrode 104 includes a plurality of grooves 118a. FIG. 10 is a schematic view of a third embodiment of the dry etching apparatus according to the present invention, wherein only insulation plate 120 of lower electrode 108 includes a plurality of grooves 118a.

The plurality of grooves 118a in the second and the third embodiments are arranged and formed in the same manner as those in the first embodiment shown by FIG. 8, and a detailed description thereof is thus omitted.

Figure 11:
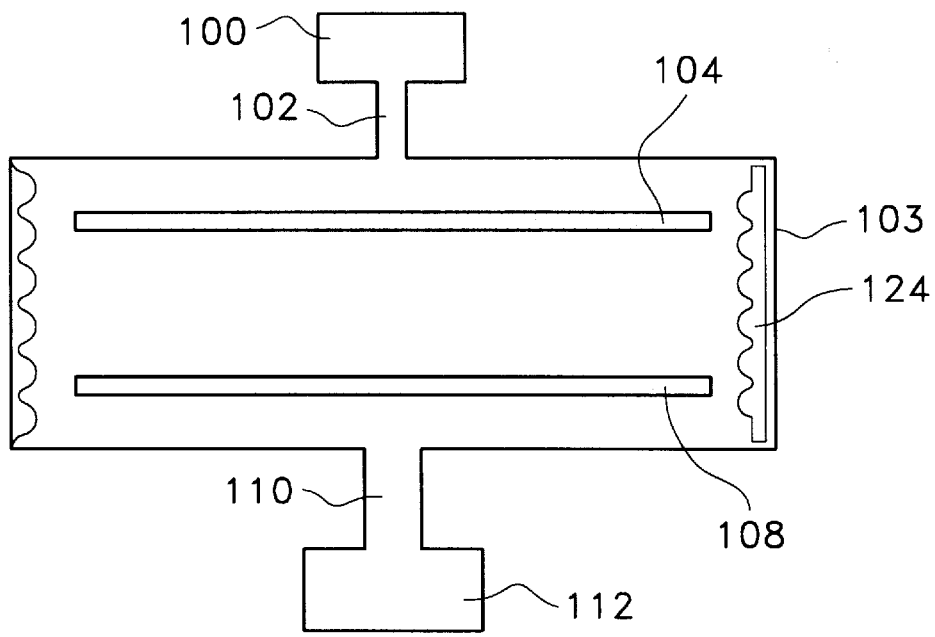
FIG. 11 is a schematic diagram of an etching chamber of the first, the second and the third embodiments, wherein sidewalls include a plurality of projections having a semicircular structure defining grooves therebetween.
Figure 12:
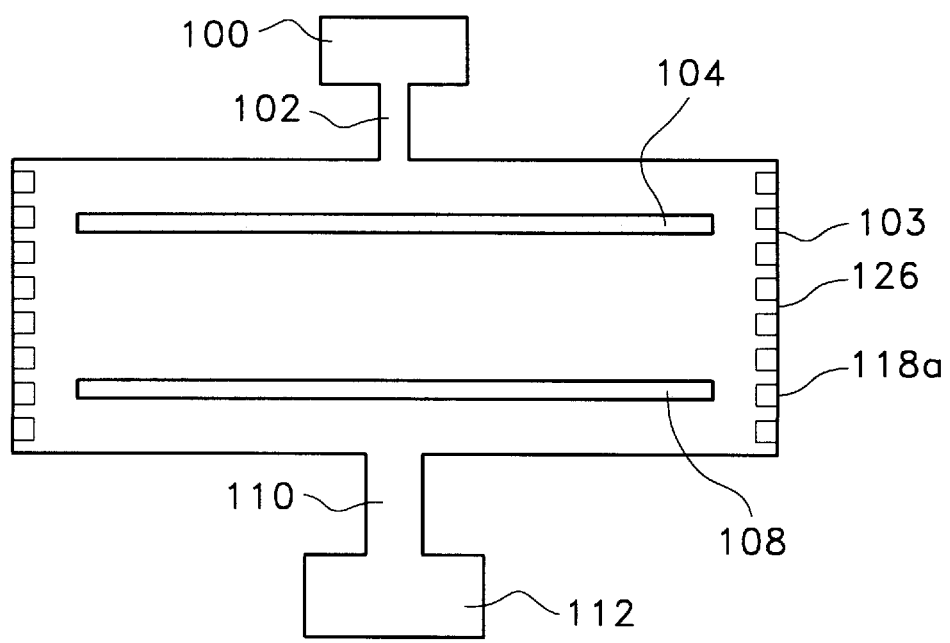
FIG. 12 is a schematic diagram of an etching chamber of the first, the second and the third embodiments, wherein sidewalls include a plurality of projections having a rectangular cross-section defining grooves therebetween.

The first, second and third embodiments of the dry etching apparatus may further include a plurality of projections and grooves formed on the inside sidewalls of the chamber 103 as shown in FIGS. 11 and 12. These projections and grooves may be made into a single body 124 or a plurality of detachable projections 126.

The projections 124 as shown in FIG. 11 have a semicircular cross-section. The projections 124 may be formed as a single body and detachably connected to the sidewall of chamber 103 as shown on the right-hand side in FIG. 11, or formed integral with the sidewalls of the chamber 103 as shown on the left-hand side in FIG. 11. The projections 124 may be modified to have various other cross-sectional shapes. These projections 124 may be used in conjunction with grooves 118a in upper and lower electrodes 104 and 108, or the projections 124 may be used with conventional electrodes.

The projections 126 as shown in FIG. 12 are detachably formed and the respective projections have a rectangular cross-section, with the grooves 118a therebetween having a square cross-section. The projections 126 may be modified to have various other cross-sectional shapes. The projections 126 may be individually detachable from the sidewall of chamber 103 as in FIG. 12, or, similarly to FIG. 11, may be formed as a single body which may be detachable as a unit from the sidewall of chamber 103.

As described previously, the distance between two adjacent grooves 118a of the projections 126 having a rectangular cross-section ranges from 0.18 to 0.22 cm. The height and the base thickness of the groove 118a range from 0.24 to 0.26 cm. For usage purposes, the design condition of the grooves and projections may be modified.

When the projections are individually detachable, the exhaustion feature of the chamber can be changed by merely replacing some of the projections. On the other hand, when the projections and grooves are made into a single body, it is required to replace the whole body of the projections and grooves to change the exhaustion feature of the chamber. However, it is easier to form the projections and grooves in a single body than the detachable projections. Therefore, a selection can be made in the structure of the projections and grooves according to the intended use. The areas of the inside sidewalls in which the projections and grooves are formed are made of a conductive material (e.g., Al) on which a thin layer of an insulation material (e.g., ceramic or $Al_2O_3$ and so on) is coated.

When the sidewalls of the chamber 103 or the insulation plates of the upper and the lower electrodes 104 and 108 each include a plurality of grooves 118a, the conductance in the chamber 103 is changed and the exhaustion velocity is improved. As a result, particle formation is suppressed. Moreover, the change in the structures of the electrodes 104 and 108 causes changes in the polymers. For example, polymers that would have been firmly adhered to the sidewalls of a conventional chamber (i.e., a chamber not having any grooves on its sidewalls, upper electrode or lower electrode), are widely dispersed and adhered to the grooves formed on the sidewalls and the insulation plates.

As an example, changes in the conductance and the resultant exhaustion velocity for a dry etching apparatus according to the second embodiment of the invention, wherein only the insulation plate of the lower electrode 108 includes a plurality of grooves 118a (e.g., one hundred and thirty six grooves), are as detailed below.

In general, conductance C can be generally determined as follows:

$$Q=C/(P_1-P_3)(\text{Torr.l/sec}) \qquad (2)$$

and $$C=Q/(P_1-P_3) \qquad (3)$$

where $P_1$ and $P_3$ are the pressures at either end of a gas duct, respectively, and Q is the quantity of a flowing gas (i.e., a quantity of flow).

However, the conductance depends on, for example, the kind of gas, the state of gas flow, the shape of the gas duct, the pressure difference in the chamber, the shape of the chamber (e.g., an angular chamber or a circular chamber). Accordingly, the conductance should be recalculated by a suitable formula according to the above conditions.

Figure 13:
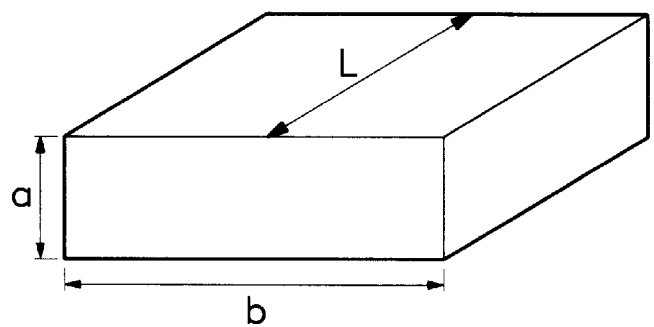
FIG. 13 is a schematic diagram showing the space between the upper and the lower electrodes.

When a gas is dispersed from a plurality of gas diffusers 106 of the upper electrode 104, the quantity of gas flow per unit area is the same according to uniform pressure distribution. For description purposes, the present invention calculates the conductance in a viscous flow state of 20° C. air according to the following formula on the assumption that the cylindrical etching chamber has an angular shape as schematically shown in FIG. 13:

$$C=260Y \cdot ((a^2b^2)/L) \cdot P(\text{l/sec}) \qquad (4)$$

where, 'a' is the distance between the upper and the lower electrodes in the etching chamber; 'b' is the length of the upper or the lower electrode; and L is the width of the upper and the lower electrodes. P is the difference between the pressures at an inlet orifice and an outlet orifice of the gas duct. Y is the correction coefficient determined by the ratio a/b. While the coefficient Y corresponding to a/b is not constant, changes in the conductance can be noted by the area ratio as determined by formula (4). Formula (4) is disclosed in *Vacuum Technology Manual* published by Industrial Research Association in Japan in April, 1990, and *Technology of Vacuum* published by Industrial Technology Service Center Co. Ltd. in Japan in November, 1990.

The change in the conductance due to the grooves can be seen by comparing the reaction volume of a conventional etching chamber 103 wherein insulation plates 116 and 120 of upper and lower electrodes 104 and 108 include no grooves, with the reaction volume of an etching chamber 103 according to the present invention wherein only an insulation plate of a lower electrode 108 includes a plurality of grooves 118a (e.g., one hundred and thirty six grooves).

For example, consider the reaction volume of the conventional etching chamber employing circular shaped upper and lower electrodes. The reaction volume $V=\pi(15\text{ cm})^2(0.6\text{ cm})=424.116\text{ cm}^3$, where 30 cm is the diameter of the lower electrode and 0.6 cm is the distance between the insulation plates of the upper and the lower electrodes. Now, if each groove has a circumferential width of 0.25 cm, a radial width of 7.5 cm, and a depth of 0.25 cm, for each groove there is an additional realized volume of 0.469 $cm^3$. With 136 grooves, the total additional volume is 136×0.469=63.75 $cm^3$. The new volume V' is thus 487.866 $cm^3$ and the ratio of V'/V is 487.866/424.116 or 1.15. Thus, there is a 15% increase in the reaction volume and conductance with the grooves.

Therefore, when a gas of 100 sccm is introduced into the etching chamber 103 through the gas supply 100 and the process pressure P2 is 2 Torr, the etching chamber according to the present invention provides an 15% improvement in exhaust velocity as compared with the exhaust velocity S of $6.3 \cdot 10^{-1}$ (l/sec) from the conventional etching chamber as determined in formula (1).

Consequently, the dry etching apparatus according to the present invention is capable of enhancing the conductance in the chamber and more effectively exhausting process induced reaction products out of the etching chamber compared with the conventional etching chamber. As a result, it is possible to disperse accumulated polymers and suppress particle formation resulting from the accumulated polymers.

While preferred embodiments of the present invention have been described, it will be understood by those skilled in the art that various changes and modifications may be made, and equivalents may be substituted for elements thereof without departing from the true scope of the present invention. Therefore, it is intended that the present invention not be limited to the particular embodiment disclosed, but that the present invention include all embodiments falling within the scope of the appended claims.

What is claimed is:

1. A dry etching apparatus comprising:
   an etching chamber providing a space for an etching process;
   a gas supply connected to a top of said etching chamber by a first gas duct;
   a pump connected to a bottom of said etching chamber by a second gas duct;
   an upper electrode disposed at an upper portion in said etching chamber, said upper electrode comprising:
     a gas diffusing member which has a circular shape and includes a plurality of gas diffusers; and
     a first insulating member having a ring shape;
   a lower electrode disposed at a lower portion in said etching chamber and opposed to said upper electrode, said lower electrode comprising:
     a wafer stage having a circular shape, for supporting a wafer; and
     a second insulating member having a ring shape,
   wherein at least one of said first insulating member of said upper electrode and said second insulating member of said lower electrode comprises a plurality of grooves.

2. The dry etching apparatus of claim 1, wherein said plurality of grooves extend radially from an inner circumference to an outer circumference of said at least one of said first or second insulating member.

3. The dry etching apparatus of claim 2, wherein a projection between each groove has a rectangular cross-sectional shape and said groove has a square cross-sectional shape.

4. The dry etching apparatus of claim 2, wherein areas of each of said first and second insulating members in which said plurality of grooves are formed are made of a conductive material coated with an insulating material.

5. The dry etching apparatus of claim 2, wherein said plurality of grooves are arranged so as to be symmetrical about a line passing through a center of said at least one of said first or second insulating member.

6. The dry etching apparatus of claim 2, wherein said plurality of grooves are arranged so as to be asymmetrical about a line passing through a center of said at least one of said first or second insulating member.

7. The dry etching apparatus of claim 2, further comprising a plurality of projections and grooves formed on inside sidewalls of said etching chamber.

8. The dry etching apparatus of claim 7, wherein areas of said inside sidewalls in which said plurality of projections and grooves are formed are made of a conductive material coated with an insulating material.

9. The dry etching apparatus of claim 8, wherein each of said plurality of projections formed on inside sidewalls of said etching chamber has a semicircular cross-sectional shape.

10. The dry etching apparatus of claim 9, wherein said areas of the inside sidewalls of the etching chamber in which said plurality of projections and grooves are formed comprise a single body.

11. The dry etching apparatus of claim 9, wherein said areas of the inside sidewalls of the etching chamber in which said plurality of projections and grooves are formed comprise individually detachable projection bodies.

12. The dry etching apparatus of claim 7, wherein each of said plurality of projections formed on inside sidewalls of said etching chamber has a rectangular cross-sectional shape.

13. The dry etching apparatus of claim 12, wherein areas of said inside sidewalls of said etching chamber in which said plurality of projections and grooves are formed comprise a single body.

14. The dry etching apparatus of claim 12, wherein areas of said inside sidewalls of said etching chamber in which said plurality of projections and grooves are formed comprise individually detachable projection bodies.

* * * * *